(12) United States Patent
Totani et al.

(10) Patent No.: US 9,515,228 B2
(45) Date of Patent: Dec. 6, 2016

(54) GROUP III NITRIDE SEMICONDUCTOR LIGHT-EMITTING DEVICE

(71) Applicant: Toyoda Gosei Co., LTD., Kiyosu-shi (JP)

(72) Inventors: Shingo Totani, Kiyosu (JP); Masashi Deguchi, Kiyosu (JP); Naoki Nakajo, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/556,886

(22) Filed: Dec. 1, 2014

(65) Prior Publication Data

US 2015/0083997 A1 Mar. 26, 2015

Related U.S. Application Data

(62) Division of application No. 13/426,534, filed on Mar. 21, 2012, now Pat. No. 8,912,559.

(30) Foreign Application Priority Data

Mar. 23, 2011 (JP) .................................. 2011-064571
Oct. 27, 2011 (JP) .................................. 2011-235687

(51) Int. Cl.
*H01L 33/02* (2010.01)
*H01L 33/38* (2010.01)
(Continued)

(52) U.S. Cl.
CPC ........... *H01L 33/46* (2013.01); *H01L 33/0025* (2013.01); *H01L 33/06* (2013.01); *H01L 33/32* (2013.01);
(Continued)

(58) Field of Classification Search
None
See application file for complete search history.

(56) References Cited

U.S. PATENT DOCUMENTS 7,723,743 B2  5/2010  Yahata et al.
8,368,100 B2  2/2013  Donofrio et al.
(Continued)

FOREIGN PATENT DOCUMENTS

CN  101399307 A  4/2009
JP  11-340514 A  12/1999
(Continued)

OTHER PUBLICATIONS

Chinese Office Action and Search Report dated Apr. 1, 2014 with English Translation.

(Continued)

*Primary Examiner* — Hoang-Quan Ho
(74) *Attorney, Agent, or Firm* — McGinn IP Law Group, PLLC

(57) ABSTRACT

A face-up-type Group III nitride semiconductor light-emitting device includes a growth substrate, an n-type layer, a light-emitting layer, a p-type layer, an n-electrode including a bonding portion and a wiring portion, a p-electrode including a bonding portion and a wiring portion, and a first insulating film. The n-type layer, the light-emitting layer, and the p-type layer are sequentially stacked on the growth substrate, and the n-electrode and the p-electrode are formed on the first insulating film. A groove having a depth extending from a top surface of the p-type layer to the n-type layer is formed in at least one region selected from a region directly below the wiring portion of the n-electrode and a region directly below the wiring portion of the p-electrode. The wiring portion, which is formed in the groove, is located at a level lower than that of the light-emitting layer.

12 Claims, 7 Drawing Sheets

(51) Int. Cl.
*H01L 33/44* (2010.01)
*H01L 33/46* (2010.01)
*H01L 33/00* (2010.01)
*H01L 33/06* (2010.01)
*H01L 33/32* (2010.01)
*H01L 33/40* (2010.01)

(52) U.S. Cl.
CPC ........... *H01L 33/382* (2013.01); *H01L 33/385* (2013.01); *H01L 33/387* (2013.01); *H01L 33/405* (2013.01); *H01L 2933/0025* (2013.01)

(56) References Cited

U.S. PATENT DOCUMENTS

| | | | |
|---|---|---|---|
| 8,643,039 B2 | 2/2014 | Donofrio et al. | |
| 2005/0211989 A1 | 9/2005 | Horio et al. | |
| 2007/0102693 A1* | 5/2007 | Nagai | F21K 9/00 257/13 |
| 2010/0059768 A1* | 3/2010 | Hasnain | H01L 27/153 257/93 |
| 2011/0068359 A1* | 3/2011 | Yahata | H01L 33/382 257/98 |
| 2011/0233588 A1* | 9/2011 | Deguchi | H01L 33/38 257/98 |
| 2011/0294242 A1* | 12/2011 | Lu | H01L 33/20 438/27 |
| 2012/0049219 A1 | 3/2012 | Kamiya et al. | |
| 2012/0241791 A1 | 9/2012 | Totani et al. | |
| 2012/0244653 A1 | 9/2012 | Totani et al. | |
| 2012/0305959 A1 | 12/2012 | Yu et al. | |
| 2013/0203194 A1 | 8/2013 | Totani et al. | |

FOREIGN PATENT DOCUMENTS

| | | |
|---|---|---|
| JP | 3531475 B2 | 5/2004 |
| JP | 2005-302747 A | 10/2005 |
| WO | WO 2010/132139 A1 | 11/2010 |

OTHER PUBLICATIONS

U.S. Office Action dated Mar. 7, 2014 in U.S. Appl. No. 13/426,534.
U.S. Notice of Allowance dated Aug. 15, 2014 in U.S. Appl. No. 13/426,534.

* cited by examiner

GROUP III NITRIDE SEMICONDUCTOR LIGHT-EMITTING DEVICE

The present application is a Divisional Application of U.S. patent application Ser. No. 13/426,534, filed on Mar. 21, 2012, which is based on and claims priority from Japanese patent application No. 2011-064571, filed on Mar. 23, 2011, and Japanese patent application No. 2011-235687, filed on Oct. 27, 2011, the entire contents of which are incorporated herein by reference.

BACKGROUND OF THE INVENTION

Field of the Invention

The present invention relates to a face-up-type Group III nitride semiconductor light-emitting device whose light extraction performance is improved by providing a reflective film in an insulating film.

Background Art

Patent documents 1 and 2 disclose a flip-chip-type Group III nitride semiconductor light-emitting device in which a reflective film is provided in an insulating film. In such a light-emitting device, migration of a metal forming the reflective film is prevented through electrical insulation of the film by enclosing the film with the insulating film.

Patent Document 1: Japanese Patent Application Laid-Open (kokai) No. H11-340514
Patent Document 2: Japanese Patent Application Laid-Open (kokai) No. 2005-302747

The Group III nitride semiconductor light-emitting device having a structure disclosed in Patent Document 1 or 2 is of a flip-chip type. Conceivably, application of such a structure to a face-up-type device could improve the light extraction performance of the device. Specifically, the light extraction performance could be improved by providing a structure in which a reflective film enclosed with an insulating film is formed below an n-electrode and a p-electrode (i.e., on the side of a sapphire substrate), so that light emitted toward the n-electrode and the p-electrode is reflected by the reflective film, to thereby inhibit absorption of light by the n-electrode and the p-electrode.

The present inventors have conducted studies on a face-up-type Group III nitride semiconductor light-emitting device having the aforementioned structure. However, the present inventors have found that the light-emitting device exhibits insufficiently improved light extraction performance, since light reflected by the reflective film is absorbed by a light-emitting layer, or light reflected by a resin for sealing the device is absorbed by a wiring portion of the n-electrode or the p-electrode.

SUMMARY OF THE INVENTION

In view of the foregoing, an object of the present invention is to provide a face-up-type Group III nitride semiconductor light-emitting device whose light extraction performance is improved by providing a reflective film enclosed with an insulating film below an n-electrode and a p-electrode.

In a first aspect of the present invention, there is provided a face-up-type Group III nitride semiconductor light-emitting device comprising a growth substrate; an n-type layer; a light-emitting layer; a p-type layer; an n-electrode having a bonding portion and a wiring portion; a p-electrode having a bonding portion and a wiring portion; a first insulating film; and a second insulating film,
the n-type layer, the light-emitting layer, and the p-type layer being sequentially stacked on the growth substrate, the n-electrode and the p-electrode being formed on the first insulating film, and a portion of each of the n-electrode and the p-electrode other than the bonding portion being covered with the second insulating film, wherein:
the light-emitting device has a reflective film incorporated in the first insulating film in a region directly below each of the n-electrode and the p-electrode, the reflective film being formed of a material exhibiting a reflectance for light of emission wavelength higher than that of the wiring portion;
a groove having a depth extending from the top surface of the p-type layer to the n-type layer is formed in at least one of a region directly below the wiring portion of the n-electrode and a region directly below the wiring portion of the p-electrode; and
the reflective film in a region directly below the region in which the groove is formed is located at a level lower than that of the light-emitting layer.

In a second aspect of the present invention, there is provided a face-up-type Group III nitride semiconductor light-emitting device comprising a growth substrate; an n-type layer; a light-emitting layer; a p-type layer; an n-electrode having a bonding portion and a wiring portion; a p-electrode having a bonding portion and a wiring portion; a first insulating film; and a second insulating film,
the n-type layer, the light-emitting layer, and the p-type layer being sequentially stacked on the growth substrate, the n-electrode and the p-electrode being formed on the first insulating film, and a portion of each of the n-electrode and the p-electrode other than the bonding portion being covered with the second insulating film, wherein:
the light-emitting device has a reflective film incorporated into the second insulating film in a region directly above each of the wiring portions of the n-electrode and the p-electrode, the reflective film being formed of a material exhibiting a reflectance for light of emission wavelength higher than that of the wiring portion;
a groove having a depth extending from the top surface of the p-type layer to the n-type layer is formed in at least one of a region directly below the wiring portion of the n-electrode and a region directly below the wiring portion of the p-electrode; and
the reflective film in a region directly above the region in which the groove is formed is located at a level lower than that of the light-emitting layer.

In a third aspect of the present invention, there is provided a face-up-type Group III nitride semiconductor light-emitting device comprising a growth substrate; an n-type layer; a light-emitting layer; a p-type layer; an n-electrode having a bonding portion and a wiring portion; a p-electrode having a bonding portion and a wiring portion; a first insulating film; and a second insulating film,
the n-type layer, the light-emitting layer, and the p-type layer being sequentially stacked on the growth substrate, the n-electrode and the p-electrode being formed on the first insulating film, and a portion of each of the n-electrode and the p-electrode other than the bonding portion being covered with the second insulating film, wherein:
the light-emitting device has a reflective film incorporated into the first insulating film in a region directly below each of the n-electrode and the p-electrode, the reflective film being formed of a material exhibiting a reflectance for light of emission wavelength higher than that of the wiring portion;
the light-emitting device has a reflective film incorporated into the second insulating film in a region directly above each of the wiring portions of the n-electrode and the p-electrode, the reflective film being formed of a material exhibiting a reflectance for light of emission wavelength higher than that of the wiring portion;

a groove having a depth extending from the top surface of the p-type layer to the n-type layer is formed in at least one of a region directly below the wiring portion of the n-electrode and a region directly below the wiring portion of the p-electrode; and the reflective films in regions directly above and below the region in which the groove is formed are located at a level lower than that of the light-emitting layer.

In a fourth aspect of the present invention, there is provided a face-up-type Group III nitride semiconductor light-emitting device comprising a growth substrate; an n-type layer; a light-emitting layer; a p-type layer; an n-electrode having a bonding portion and a wiring portion; a p-electrode having a bonding portion and a wiring portion; and a first insulating film, the n-type layer, the light-emitting layer, and the p-type layer being sequentially stacked on the growth substrate, and the n-electrode and the p-electrode being formed on the first insulating film, wherein:

a groove having a depth extending from the top surface of the p-type layer to the n-type layer is formed in at least one of a region directly below the wiring portion of the n-electrode and a region directly below the wiring portion of the p-electrode;

the wiring portion in the region in which the groove is formed is located at a level lower than that of the light-emitting layer; and each of the n-electrode and the p-electrode is formed of Ag, Al, an Ag alloy, or an Al alloy.

In the first to fourth aspects, the term "below" refers to the case where a region is located more proximal to the growth substrate, and the term "above" refers to the case where a region is located more distal in relation to the growth substrate.

The reflective film may be a single-layer film or a multi-layer film. In order to improve adhesion of the reflective film to the insulating film, a film formed of, for example, Ti may be provided between the insulating film and the reflective film. The material of the reflective film may be, for example, Al, Ag, an Al alloy, an Ag alloy, or a dielectric multi-layer film.

The wiring portion of the n-electrode may be connected to the n-type layer by the mediation of an intermediate electrode provided on the n-type layer. The wiring portion of the p-electrode may be connected to an ITO electrode on the p-type layer by the mediation of an intermediate electrode provided on the ITO electrode.

The groove may also be provided in a region directly below the bonding portion of the n-electrode or the bonding portion of the p-electrode. However, in such a case, difficulty may be encountered in bonding a wire to the bonding portion of the n-electrode or the bonding portion of the p-electrode.

The reflective film in a region directly below the wiring portion of the n-electrode or the wiring portion of the p-electrode may be provided directly on the n-type layer or the p-type layer.

In the first or third aspect of the invention, the reflective film located directly below the wiring portion may be provided directly on a portion of the n-type layer exposed through the bottom of the groove.

In any of the first to third aspects of the invention, the reflective film may be is formed of Ag, Al, an Ag alloy, an Al alloy, or a dielectric multi-layer film.

In any of the first to fourth aspects of the invention, the groove may be provided in a region directly below the wiring portion of the n-electrode.

In any of the first to fourth aspects of the invention, the groove may be is provided directly below each of the wiring portions of the n-electrode and the p-electrode.

According to the present invention, there is reduced absorption of light reflected by the reflective film by the wiring portion of the n-electrode or the p-electrode or the light-emitting layer. Also, light propagating in a plane parallel to the main surface of the device is readily extracted from side surfaces of the groove. Therefore, light extraction performance is improved.

As described in the aspect, the reflective film may be formed of Ag, Al, an Ag alloy, an Al alloy, or a dielectric multi-layer film.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
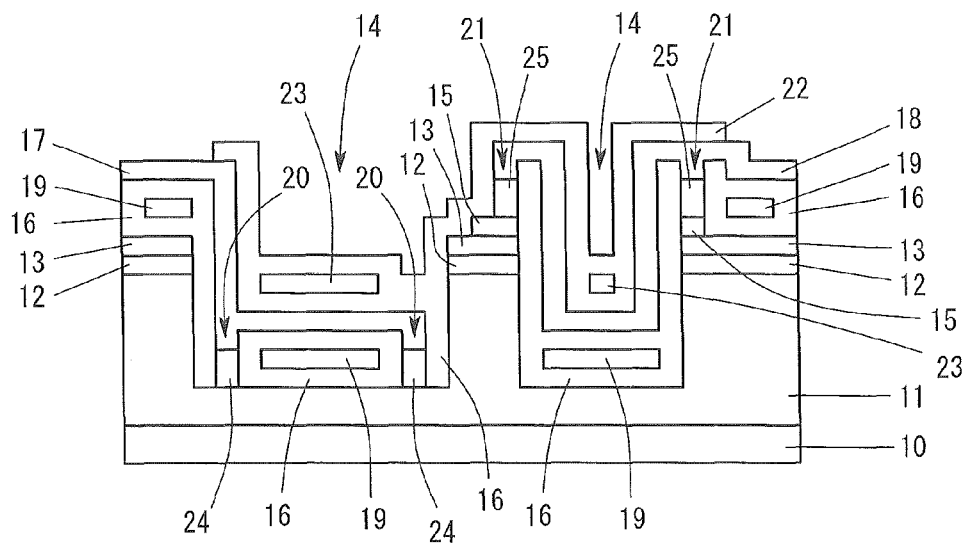
FIG. 1 is a cross-sectional view of the configuration of a Group III nitride semiconductor light-emitting device according to Embodiment 1.
Figure 2:
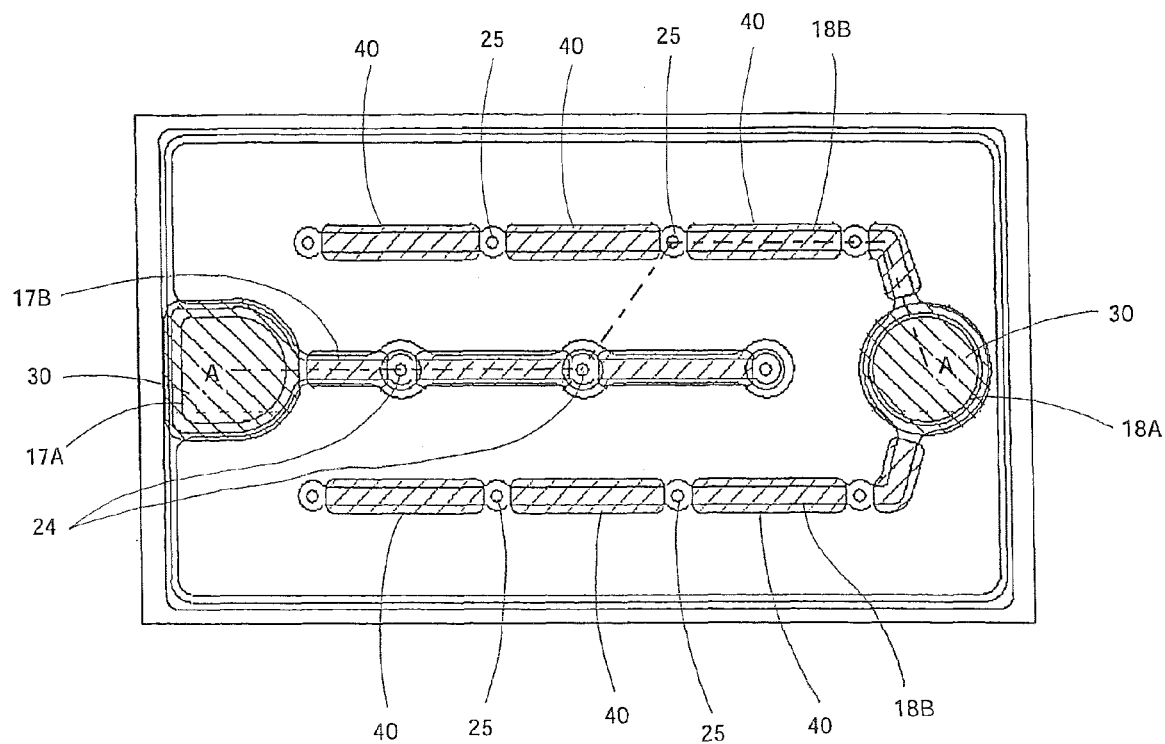
FIG. 2 is a top plan view of the Group III nitride semiconductor light-emitting device according to Embodiment 1.

FIG. 1 shows the configuration of a face-up-type Group III nitride semiconductor light-emitting device according to Embodiment 1. FIG. 2 is a top view of the Group III nitride semiconductor light-emitting device according to Embodiment 1. FIG. 1 corresponds to a cross section taken along line A-A of FIG. 2.

As shown in FIG. 2, the Group III nitride semiconductor light-emitting device according to Embodiment 1 has a rectangular shape in plan view, and includes an n-electrode 17 and a p-electrode 18. The n-electrode 17 has a bonding portion 17A, and a wiring portion 17B continuous with the bonding portion 17A. Also, the p-electrode 18 has a bonding portion 18A and a wiring portion 18B. The bonding portion 17A or 18A is a region to which a bonding wire is connected, and voltage is applied to the n-electrode 17 or the p-electrode 18 by means of the bonding wire. The wiring portion 17B or 18B has a linear structure extending in a direction parallel to the main surface of the device, which improves current diffusion in a direction parallel to the main surface of the device.

As shown in FIG. 1, the Group III nitride semiconductor light-emitting device according to Embodiment 1 includes a sapphire substrate 10; and an n-type layer 11, a light-emitting layer 12, and a p-type layer 13, which are sequentially stacked on the sapphire substrate 10, and each of which is formed of a Group III nitride semiconductor. Each of the n-type layer 11, the light-emitting layer 12, and the p-type layer 13 may have any of conventionally known structures. For example, the n-type layer 11 has a structure in which an n-contact layer, an ESD layer, and an n-cladding layer are sequentially stacked on the sapphire substrate 10. For example, the light-emitting layer 12 has an MQW structure in which InGaN well layers and GaN barrier layers are alternately stacked. For example, the p-type layer 13 has a structure in which a p-cladding layer doped and a p-contact layer are sequentially stacked on the light-emitting layer 12. An ITO electrode 15 is formed on a specific region of the p-type layer 13. The ITO electrode 15 may be replaced with an electrode formed of any material exhibiting permeability for light of emission wavelength of the Group III nitride semiconductor light-emitting device; for example, an electrode formed of an electrically conductive transparent oxide such as ICO (indium cerium oxide) or IZO (indium zinc oxide), or a metal thin film such as Au thin film. In a region overlapping (in plan view) with the wiring portion 17B of the n-electrode 17 or the wiring portion 18B of the p-electrode 18, there are provided grooves 14 having a depth extending from the top surface (i.e., the surface on the side opposite the sapphire substrate 10) of the p-type layer 13 to the n-type layer 11 (to the n-contact layer in the case where the n-type layer 11 is formed of a plurality of layers). A plurality of n-side intermediate electrodes 24 are provided in specific regions at the bottoms of the grooves 14, and a plurality of p-side intermediate electrodes 25 are provided in specific regions on the ITO electrode 15. Each of the n-side intermediate electrodes 24 and the p-side intermediate electrodes 25 has, for example, a structure of Ni/Au/Al (i.e., a structure in which an Ni film, an Au film, and an Al film are sequentially stacked on the sapphire substrate 10) wherein the symbol "/" refers to a layered structure; for example, "A/B" refers to a layered structure in which layer B is formed after formation of layer A (the same shall apply hereinafter).

A $SiO_2$ insulating film 16 (corresponding to the first insulating film of the present invention) is provided so as to continuously cover the side surfaces and bottom surface of the grooves 14, the p-type layer 13, and the ITO electrode 15. The insulating film 16 may be formed of, in place of $SiO_2$, an insulating material exhibiting permeability for light of emission wavelength of the Group III nitride semiconductor light-emitting device, such as $Si_3N_4$, $Al_2O_3$, or $TiO_2$. The insulating film 16 includes therein reflective films 19 which are formed in regions directly below the n-electrode 17 and the p-electrode 18 (the term "below" refers to the case where a region is located on the side of the sapphire substrate 10 (the same shall apply hereinafter), and the term "above" refers to the case where a region is located on the side opposite the sapphire substrate 10). The reflective films 19 are enclosed with the insulating film 16 and thus are electrically insulated, whereby metal migration is prevented. Since the grooves 14 are provided, the reflective films 19 in regions directly below the wiring portion 17B of the n-electrode 17 and the wiring portion 18B of the p-electrode 18 are located at a level lower than that of the light-emitting layer 12. Meanwhile, the reflective films 19 in regions directly below the bonding portion 17A of the n-electrode 17 and the bonding portion 18A of the p-electrode 18 are located at a level higher than that of the p-type layer 13 (the term "above" refers to the case where a region is located more distal from the sapphire substrate 10; the same shall apply hereinafter).

Each of the reflective films 19 is formed of a material exhibiting a reflectance higher than that of the n-electrode 17 or the p-electrode 18, such as Al, Ag, an Al alloy, or an Ag alloy. The reflective film 19 may be a single-layer film or a multi-layer film. When the reflective film 19 is a multi-layer film, the film may be formed of, for example, Al alloy/Ti, Ag alloy/Al, Ag alloy/Ti, Al/Ag/Al, or Ag alloy/Ni. In order to improve adhesion of the reflective film 19 to the insulating film 16, a thin film formed of, for example, Ti, Cr, or Al may be provided between the reflective film 19 and the insulating film 16. The reflective film 19 may be formed of a dielectric multi-layer film. The dielectric multi-layer film is a multi-layer film formed of a plurality of alternately stacked pairs of films, each pair including a film formed of a material of low refractive index and a film formed of a material of high refractive index, wherein the thickness d of each film is adjusted so as to satisfy the relation $d=\lambda/(4 \times n)$ ($\lambda$: wavelength of interest (emission wavelength of the Group III nitride semiconductor light-emitting device according to Embodiment 1), n: refractive index of the film). The material of low refractive index may be, for example, $SiO_2$ (refractive index: about 1.46) or $MgF_2$ (refractive index: about 1.38), and the material of high refractive index may be, for example, SiN (refractive index: about 2.0), $TiO_2$ (refractive index: about 2.3), $ZrO_2$ (refractive index: about 2.05), or $Ta_2O_5$ (refractive index: about 2.16). From the viewpoint of improvement of the reflectance of the dielectric multi-layer film, preferably, a large difference in refractive index is provided between the material of low refractive index and the material of high refractive index. The dielectric multi-layer film is preferably formed of a large number of pairs of films. The number of pairs of films is preferably 9 or more. However, when the dielectric multi-layer film is formed of a very large number of pairs of films, the overall thickness of the dielectric multi-layer film increases, and problems may arise in production processes. Therefore, the number of pairs of films is preferably 30 or less. Specific examples of the dielectric multi-layer film include a multi-layer film formed of alternately stacked 12 pairs of films, each pair including an $SiO_2$ film having a thickness of 78 nm and an SiN film having a thickness of 56 nm, and a multi-layer film formed of alternately stacked 12 pairs of films, each pair including an $SiO_2$ film having a thickness of 78 nm and an $TiO_2$ film having a thickness of 45 nm.

On the insulating film 16 are formed the n-electrode 17 having the bonding portion 17A and the wiring portion 17B, and the p-electrode 18 having the bonding portion 18A and the wiring portion 18B. Each of the n-electrode 17 and the p-electrode 18 is formed of, for example, Ti/Ni/Au/Al. Since the grooves 14 are provided, the wiring portion 17B and the wiring portion 18B are located at a level lower than that of the light-emitting layer 12. Meanwhile, the bonding portion 17A and the bonding portion 18A are located directly above the p-type layer 13 by the mediation of the insulating film 16. The insulating film 16 has holes 20 and 21 for exposing the n-side intermediate electrodes 24 and the p-side intermediate electrodes 25. The wiring portion 17B of the n-electrode 17 is connected to the n-side intermediate electrodes 24 via the holes 20, and the wiring portion 18B of the p-electrode 18 is connected to the p-side intermediate electrodes 25 via the holes 21. The n-side intermediate electrodes 24 are provided for the purpose of improving contact between the n-type layer 11 and the n-electrode 17, and the p-side intermediate electrodes 25 are provided for the purpose of improving contact between the ITO electrode 15 and the p-electrode 18.

The n-electrode 17 and the p-electrode 18 (excluding the bonding portions 17A and 18A) are covered with an $SiO_2$ insulating film 22 (corresponding to the second insulating film of the present invention). The insulating film 22 may be formed of, in place of $SiO_2$, an insulating material exhibiting transparency for light of emission wavelength of the Group III nitride semiconductor light-emitting device, such as $Si_3N_4$, $Al_2O_3$, or $TiO_2$. The insulating film 22 includes therein reflective films 23 in regions directly above the wiring portion 17B and the wiring portion 18B. Similar to the case of the reflective films 19, the reflective films 23 are enclosed with the insulating film 22 and thus are electrically insulated, whereby metal migration is prevented. Since the grooves 14 are provided, the reflective films 23 are located at a level lower than that of the light-emitting layer 12.

Each of the reflective films 23 is formed of a material exhibiting a reflectance higher than that of the n-electrode 17 or the p-electrode 18, such as Al, Ag, an Al alloy, or an Ag alloy. The material of the reflective film 23 may be identical to or different from that of the reflective film 19. The reflective film 23 may be a single-layer film or a multi-layer film. When the reflective film 23 is a multi-layer film, the film may be formed of, for example, Al alloy/Ti, Ag alloy/Al, Ag alloy/Ti, Al/Ag/Al, or Ag alloy/Ni. In order to improve adhesion of the reflective film 23 to the insulating film 22, a thin film formed of, for example, Ti, Cr, or Al may be provided between the reflective film 23 and the insulating film 22. Similar to the case of the reflective film 19, the reflective film 23 may be formed of a dielectric multi-layer film.

As shown in plan view in FIG. 2, shaded portions correspond to regions in which the reflective films 19 and 23 are formed. Shaded portions 30 (diagonally right-down shaded portions) correspond to regions in which only the reflective films 19 are provided in plan view, and which are located directly below the bonding portion 17A of the n-electrode 17 and the bonding portion 18A of the p-electrode 18 (the term "below" refers to the case where a region is located more proximal to the sapphire substrate 10; the same shall apply hereinafter). Shaded portions 40 (diagonally right-up shaded portions) correspond to regions in which the reflective films 19 overlap with the reflective films 23 in plan view. The reflective films 19 are located in regions directly below the wiring portion 17B of the n-electrode 17 and the wiring portion 18B of the p-electrode 18, and the reflective films 23 are located in regions directly above the wiring portion 17B and the wiring portion 18B.

The Group III nitride semiconductor light-emitting device according to Embodiment 1 is of a face-up type, in which light is extracted from the top side of the device (i.e., the side of the n-electrode 17 and the p-electrode 18). Since the reflective films 19 enclosed with the insulating film 16 and the reflective films 23 enclosed with the insulating film 22 are provided directly below the n-electrode 17 and the p-electrode 18, absorption of light by the n-electrode 17 and the p-electrode 18 is inhibited, whereby light extraction performance is improved. In the device, the reflective films 19 in regions directly below the wiring portion 17B of the n-electrode 17 and the wiring portion 18B of the p-electrode 18, as well as the reflective films 23 in regions directly above the wiring portion 17B and the wiring portion 18B are located at a level lower than that of the light-emitting layer 12. Therefore, light reflected by the reflective films 19 and 23 is less likely to be directed toward the light-emitting layer 12, and absorption of light by the light-emitting layer 12 is suppressed. Meanwhile, light transmitted from the side below the wiring portions 17B and 18B is reflected by the difference in refractive index between the insulating film 16 and the n-type layer 11, and absorption of light by the wiring portions 17B and 18B is suppressed. When the device is sealed with a sealing resin, light which is reflected by the sealing resin and returns to the wiring portion 17B of the n-electrode 17 and the wiring portion 18B of the p-electrode 18 is reflected by the reflective films 23, and thus absorption of light by the wiring portions 17B and 18B is prevented. Also, light propagating in a direction parallel to the main surface of the device (i.e., plane parallel to the main surface of the sapphire substrate 10) is readily extracted from the side surfaces of the grooves 14 to the outside of the device. For these reasons, the Group III nitride semiconductor light-emitting device according to Embodiment 1 exhibits improved light extraction performance.

Next will be described processes for producing the Group III nitride semiconductor light-emitting device according to Embodiment 1.

Figure 3A:
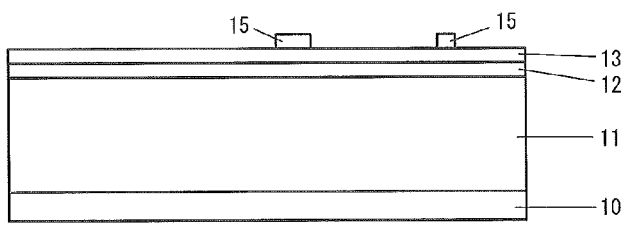
FIGS. 3A to 3F are sketches showing processes for producing the Group III nitride semiconductor light-emitting device according to Embodiment 1.

Firstly, an n-type layer 11, a light-emitting layer 12, and a p-type layer 13 are sequentially formed on a sapphire substrate 10 by MOCVD. The raw material gases, etc. employed for MOCVD are as follows: TMG (trimethylgallium) as a Ga source, TMI (trimethylindium) as an In source, TMA (trimethylaluminum) as an Al source, ammonia as a nitrogen source, silane as an n-type doping gas, cyclopentadienylmagnesium as a p-type doping gas, and hydrogen or nitrogen as a carrier gas. Then, ITO electrodes 15 (thickness: 100 nm) are formed by vapor deposition on regions of the p-type layer 13 (FIG. 3A).

Figure 3B:
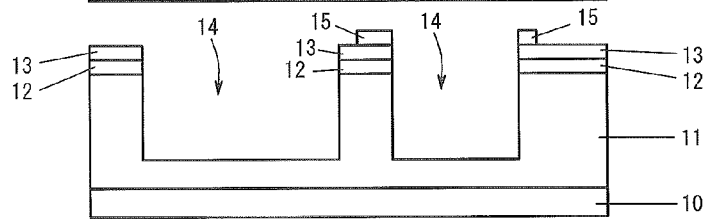

Subsequently, specific portions of the p-type layer 13 are subjected to dry etching, to thereby form grooves 14 so that the n-type layer 11 is exposed through the bottoms of the grooves 14 (FIG. 3B). The grooves 14 are formed by etching to have such a depth that reflective films 19 and 23 which will be formed later are located at a level lower than that of the light-emitting layer 12 (on the side of the sapphire substrate 10).

Figure 3C:
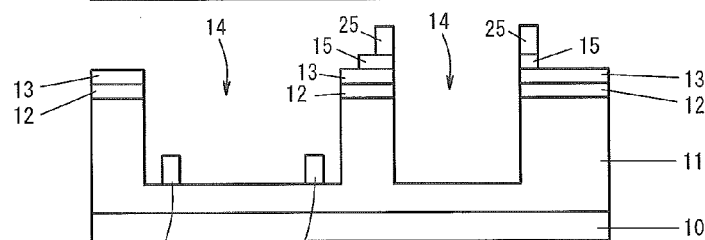

Then, p-side intermediate electrodes 25 and n-side intermediate electrodes 24 are formed, by vapor deposition and the lift-off process, on specific regions of the ITO electrodes 15 and on specific regions of the n-type layer 11 exposed through the groove bottoms, respectively, followed by washing and thermal treatment at 570° C. (FIG. 3C). The n-side intermediate electrode 24 and the p-side intermediate electrode 25 may be separately formed from different materials. However, when the n-side intermediate electrode 24 and the p-side intermediate electrode 25 are formed from the same material, these electrodes can be formed simultaneously. Therefore, production processes can be simplified, and production cost can be reduced.

Figure 3D:
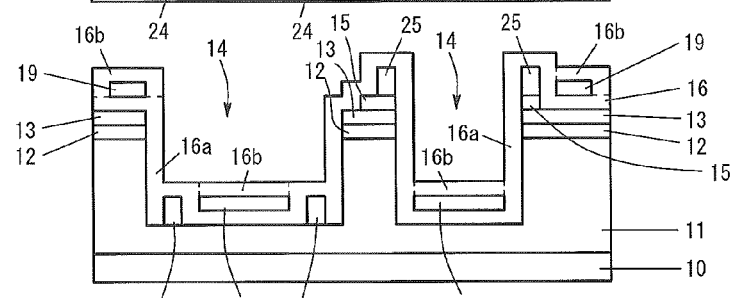

Next, a first insulating film 16a (thickness: 100 nm) is formed on the entire top surface of the resultant product by CVD. Then, reflective films 19 are formed on specific regions (corresponding to regions directly below an n-electrode 17 and a p-electrode 18 which will be formed later) of the first insulating film 16a by vapor deposition and the lift-off process. The reflective films 19 may be formed by, in place of the lift-off process, patterning (e.g., etching). Since the depth of the grooves 14 is designed as described in the process of FIG. 3B, the reflective films 19 in regions directly below the wiring portion 17B of the n-electrode 17 and the wiring portion 18B of the p-electrode 18 are located at a level lower than that of the light-emitting layer 12 (on the side of the sapphire substrate 10). Meanwhile, the reflective films 19 in regions directly below the bonding portion 17A of the n-electrode 17 and the bonding portion 18A of the p-electrode 18 are located at a level higher than that of the p-type layer 13. Then, second insulating films 16b (thickness: 100 nm) are formed on the first insulating film 16a and on the reflective films 19 by CVD. The first insulating film 16a and the second insulating films 16b together form an insulating film 16, to thereby form a structure in which the reflective films 19 are enclosed with the insulating film 16 (FIG. 3D).

Figure 3E:
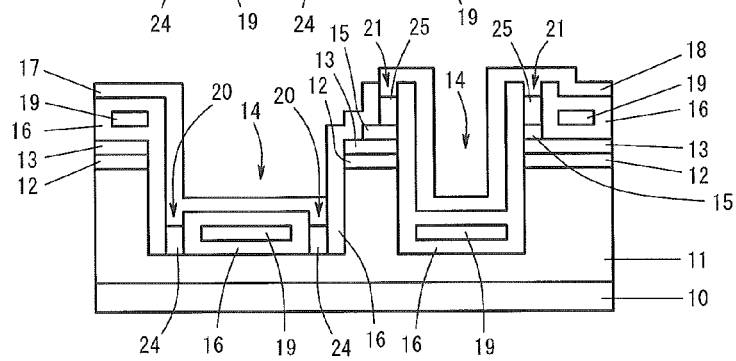

Subsequently, portions of the insulating film 16 corresponding to the tops of the n-side intermediate electrodes 24 and the p-side intermediate electrodes 25 are subjected to dry etching, to thereby form holes 20 and 21 so that the n-side intermediate electrodes 24 and the p-side intermediate electrodes 25 are exposed through the bottoms of the holes 20 and 21. Then, the n-electrode 17 and the p-electrode 18 are formed on regions of the insulating film 16 corresponding to the reflective films 19 by vapor deposition and the lift-off process (FIG. 3E). Thus, the n-side intermediate electrodes 24 are connected to the wiring portion 17B of the n-electrode 17 via the holes 20, and the p-side intermediate electrodes 25 are connected to the wiring portion 18B of the p-electrode 18 via the holes 21. Since the depth of the grooves 14 is designed as described in the process of FIG. 3B, the wiring portion 17B of the n-electrode 17 and the wiring portion 18B of the p-electrode 18 are located at a level lower than that of the light-emitting layer 12. The bonding portion 17A of the n-electrode 17 and the bonding portion 18A of the p-electrode 18 are located, by the mediation of the insulating film 16, above the reflective films 19 provided above the p-type layer 13.

Figure 3F:
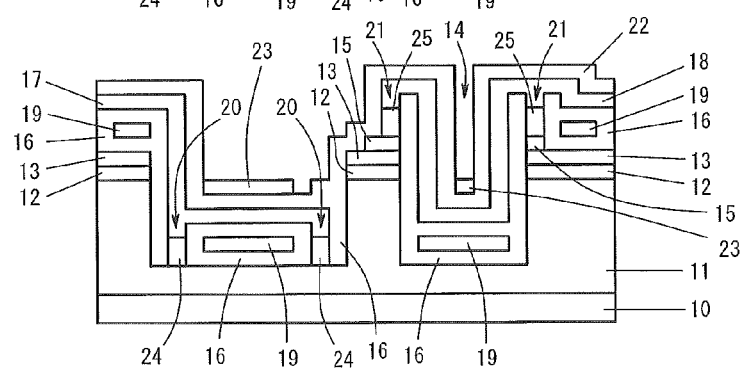

Next, an insulating film 22 (thickness: 100 nm) is formed on the entire top surface of the resultant product by CVD. Then, reflective films 23 are formed on specific regions (corresponding to regions directly above the wiring portion 17B of the n-electrode 17 and the wiring portion 18B of the p-electrode 18) of the insulating film 22 by vapor deposition and the lift-off process (FIG. 3F). The reflective films 23 may be formed by, in place of the lift-off process, patterning (e.g., etching). Since the depth of the grooves 14 is designed as described in the process of FIG. 3B, the reflective films 23 are located at a level lower than that of the light-emitting layer 12.

Thereafter, an insulating film 22 is again formed on the entire top surface of the resultant product, to thereby enclose the reflective films 23 with the insulating film 22. Then, holes are formed, by dry etching, in a region of the insulating film directly above the bonding portion 17A of the n-electrode 17 and in a region of the insulating film directly above the bonding portion 18A of the p-electrode 18, so that the bonding portion 17A and the bonding portion 18A are exposed through the bottoms of the holes. Thus, the Group III nitride semiconductor light-emitting device according to Embodiment 1, which is shown in FIGS. 1 and 2, is produced.

Embodiment 2

Figure 4:
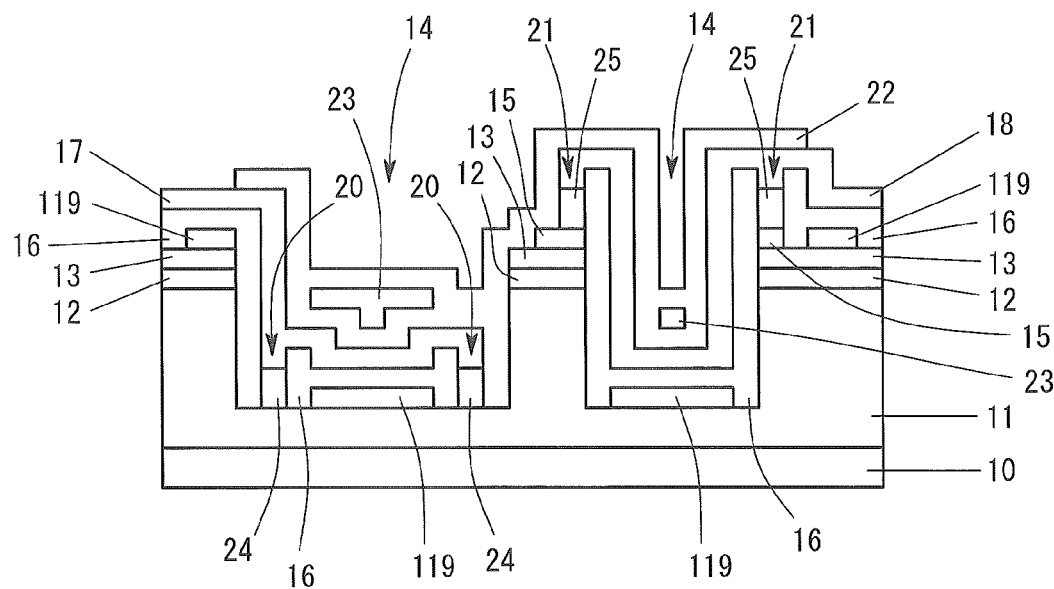
FIG. 4 is a cross-sectional view of the configuration of a Group III nitride semiconductor light-emitting device according to Embodiment 2.

FIG. 4 is a cross-sectional view of the configuration of a face-up-type Group III nitride semiconductor light-emitting device according to Embodiment 2. The Group III nitride semiconductor light-emitting device according to Embodiment 2 has the same configuration as the Group III nitride semiconductor light-emitting device according to Embodiment 1, except that the reflective films 19 are replaced with reflective films 119 which are provided directly on the n-type layer 11 and on the p-type layer 13 (without the mediation of the insulating film 16). Similar to the case of the reflective films 19, the reflective films 119 are provided directly below the wiring portion 17B of the n-electrode 17 and the wiring portion 18B of the p-electrode 18 by the mediation of the insulating film 16, and are located at a level lower than that of the light-emitting layer 12.

Similar to the case of Embodiment 1, the Group III nitride semiconductor light-emitting device according to Embodiment 2 exhibits improved light extraction performance. The reasons for this are as follows. The reflective films 119 in regions directly below the wiring portion 17B of the n-electrode 17 and the wiring portion 18B of the p-electrode 18, as well as the reflective films 23 in regions directly above the wiring portion 17B and the wiring portion 18B are located at a level lower than that of the light-emitting layer 12. Therefore, light reflected by the reflective films 119 and 23 is less likely to be directed toward the light-emitting layer 12, and absorption of light by the light-emitting layer 12 is suppressed. When the device is sealed with a sealing resin, light which is reflected by, the sealing resin and returns to the wiring portion 17B of the n-electrode 17 and the wiring portion 18B of the p-electrode 18 is reflected by the reflective films 23, and thus absorption of light by the wiring portions 17B and 18B is prevented. Also, light propagating in a direction parallel to the main surface of the device (i.e., plane parallel to the main surface of the sapphire substrate 10) is readily extracted from the side surfaces of the grooves 14 to the outside of the device.

For production of the Group III nitride semiconductor light-emitting device according to Embodiment 2, the process for forming the first insulating film 16a—which is required for production of the Group III nitride semiconductor light-emitting device according to Embodiment 1—can be omitted. Therefore, in the case of Embodiment 2, production processes can be further simplified.

In Embodiment 2, the reflective films 119 are provided directly on the n-type layer 11 and the p-type layer 13. Therefore, the reflective films 119 are preferably formed of a material which does not come into ohmic contact with the n-type layer 11 or the p-type layer 13; for example, Al or an Al alloy. Each of the reflective films 119 may be a single-layer film or a multi-layer film.

Embodiment 3

Figure 5:
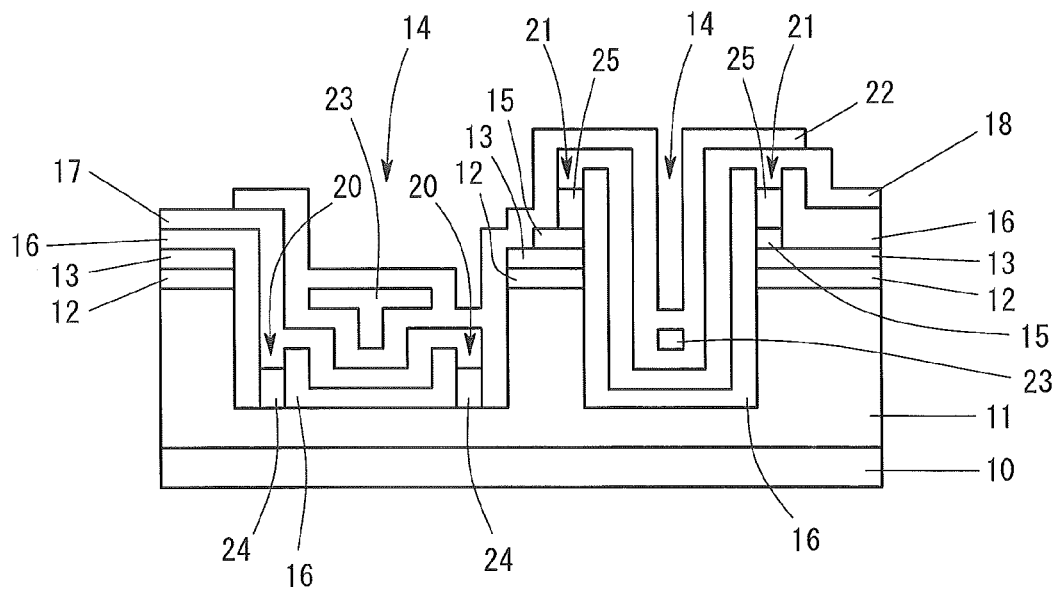
FIG. 5 is a cross-sectional view of the configuration of a Group III nitride semiconductor light-emitting device according to Embodiment 3.

FIG. 5 is a cross-sectional view of the configuration of a face-up-type Group III nitride semiconductor light-emitting device according to Embodiment 3. The Group III nitride semiconductor light-emitting device according to Embodiment 3 has the same configuration as the Group III nitride semiconductor light-emitting device according to Embodiment 1, except that the reflective films 19 are omitted.

Similar to the case of Embodiment 1, the Group III nitride semiconductor light-emitting device according to Embodiment 3 exhibits improved light extraction performance. The reasons for this are as follows. The reflective films 23 in regions directly above the wiring portion 17B of the n-electrode 17 and the wiring portion 18B of the p-electrode 18 are located at a level lower than that of the light-emitting layer 12. Therefore, light reflected by the reflective films 23 is less likely to be directed toward the light-emitting layer 12, and absorption of light by the light-emitting layer 12 is suppressed. When the device is sealed with a sealing resin, light which is reflected by the sealing resin and returns to the wiring portion 17B of the n-electrode 17 and the wiring portion 18B of the p-electrode 18 is reflected by the reflective films 23, and thus absorption of light by the wiring portions 17B and 18B is prevented. Also, light propagating in a direction parallel to the main surface of the device (i.e., plane parallel to the main surface of the sapphire substrate 10) is readily extracted from the side surfaces of the grooves 14 to the outside of the device.

For production of the Group III nitride semiconductor light-emitting device according to Embodiment 3, the process for forming the reflective films 19 can be omitted. Therefore, production processes can be simplified, as compared with the case of the Group III nitride semiconductor light-emitting device according to Embodiment 1.

Embodiment 4

Figure 6:
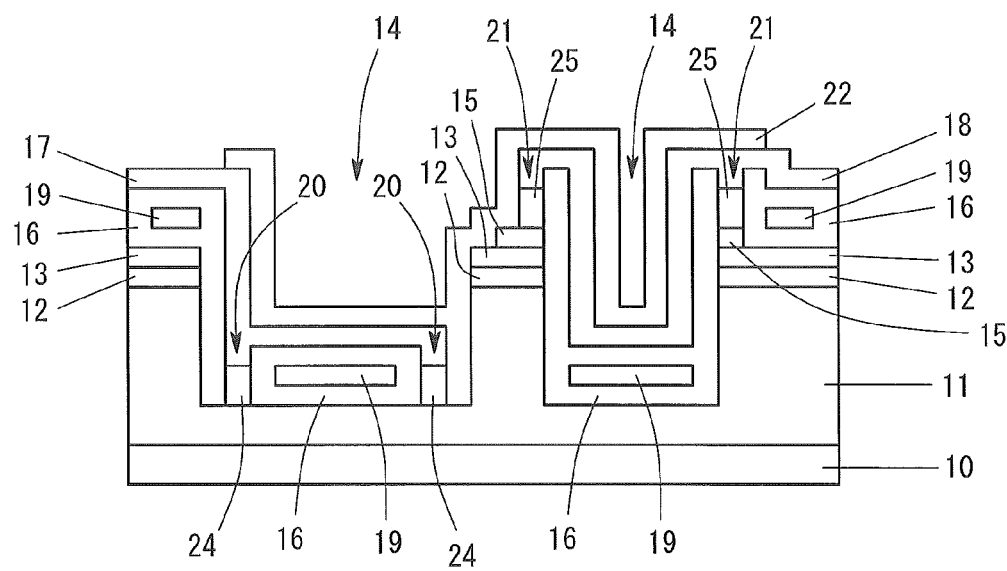
FIG. 6 is a cross-sectional view of the configuration of a Group III nitride semiconductor light-emitting device according to Embodiment 4.

FIG. 6 is a cross-sectional view of the configuration of a face-up-type Group III nitride semiconductor light-emitting device according to Embodiment 4. The Group III nitride semiconductor light-emitting device according to Embodiment 4 has the same configuration as the Group III nitride semiconductor light-emitting device according to Embodiment 1, except that the reflective films 23 are omitted.

The Group III nitride semiconductor light-emitting device according to Embodiment 4 exhibits improved light extraction performance for the reasons described below. The reflective films 19 in regions directly below the wiring portion 17B of the n-electrode 17 and the wiring portion 18B of the p-electrode 18 are located at a level lower than that of the light-emitting layer 12. Therefore, light reflected by the reflective films 19 is less likely to be directed toward the light-emitting layer 12, and absorption of light by the light-emitting layer 12 is suppressed. Also, light propagating in a direction parallel to the main surface of the device (i.e., plane parallel to the main surface of the sapphire substrate 10) is readily extracted from the side surfaces of the grooves 14 to the outside of the device. For these reasons, the Group III nitride semiconductor light-emitting device according to Embodiment 4 exhibits improved light extraction performance.

For production of the Group III nitride semiconductor light-emitting device according to Embodiment 4, the process for forming the reflective films 23 can be omitted. Therefore, production processes can be simplified, as compared with the case of the Group III nitride semiconductor light-emitting device according to Embodiment 1.

Embodiment 5

Figure 8:
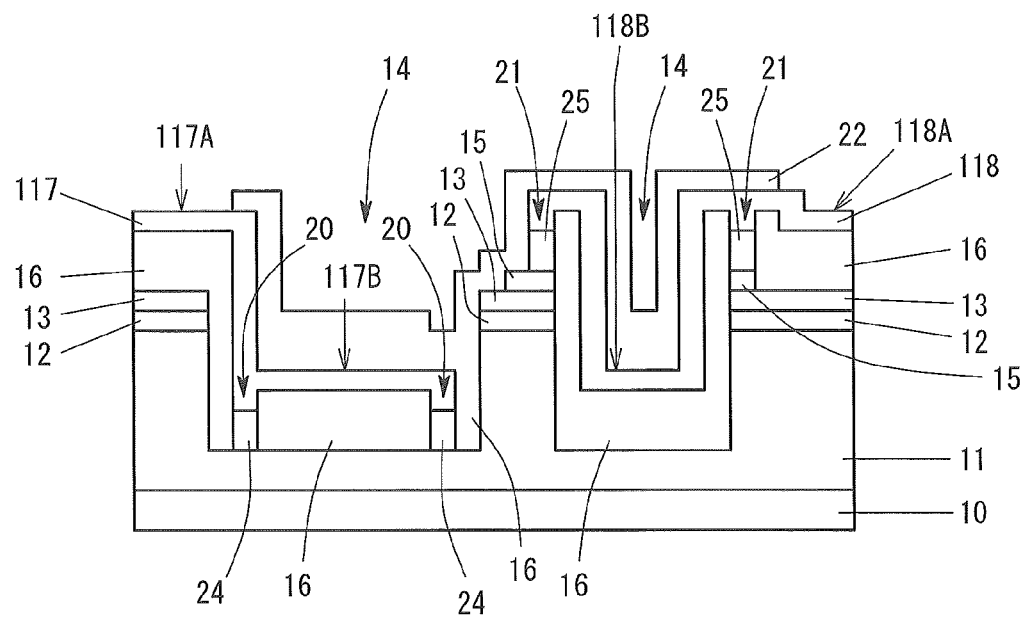
FIG. 8 is a cross-sectional view of the configuration of a Group III nitride semiconductor light-emitting device according to Embodiment 5.

FIG. 8 is a cross-sectional view of the configuration of a face-up-type Group III nitride semiconductor light-emitting device according to Embodiment 5. The Group III nitride semiconductor light-emitting device according to Embodiment 5 has the same configuration as the Group III nitride semiconductor light-emitting device according to Embodiment 1, except that the reflective films 19 and 23 are omitted, and the n-electrode 17 and the p-electrode 18 are respectively replaced with an n-electrode 117 and a p-electrode 118, each of which is formed of an electrically conductive material of high reflectance as in the case of the reflective film 19 or 23. Although the materials of the n-electrode 117 and the p-electrode 118 are different from those of the n-electrode 17 and the p-electrode 18, respectively, the n-electrode 117 and the p-electrode 118 have the same structures as the n-electrode 17 and the p-electrode 18, respectively. Specifically, the n-electrode 117 has a bonding portion 117A and a wiring portion 117B, and the p-electrode 118 has a bonding portion 118A and a wiring portion 118B. The electrically conductive material of high reflectance exhibits high reflectance for light of emission wavelength of the Group III nitride semiconductor light-emitting device. The electrically conductive material of high reflectance may be a single-layer material formed of Ag, Al, an Ag alloy, an Al alloy, or the like, or a multi-layer material containing such a single-layer material; for example, Al alloy/Ti/Au/Al, Ag alloy/Al, Ag alloy/Ti/Au/Al, Al/Ag/Al, or Ag alloy/Ni/Ti/Au/Al.

Figure 9:
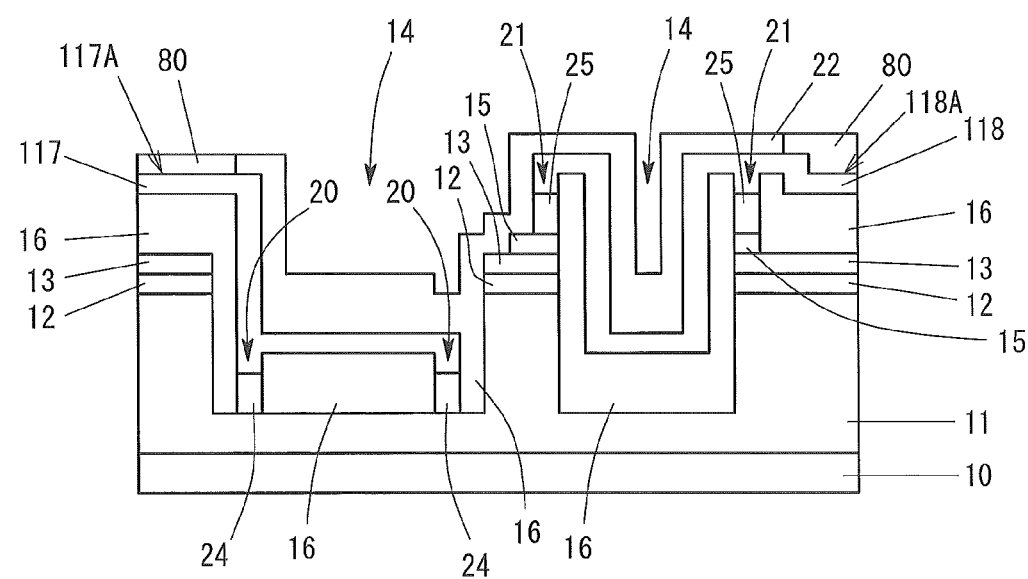
FIG. 9 is a cross-sectional view of the configuration of a Group III nitride semiconductor light-emitting device according to another embodiment.
Figure 10:
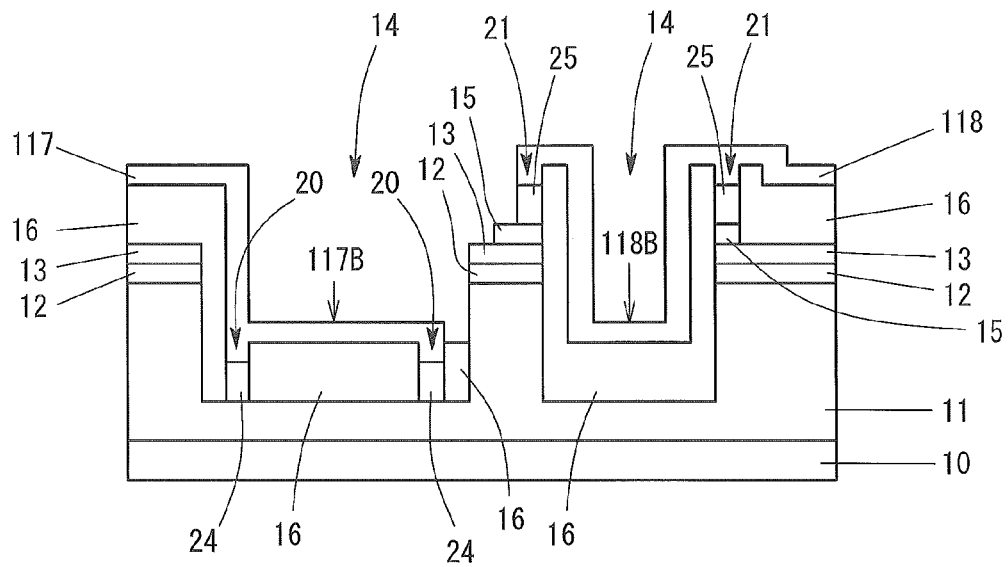
FIG. 10 is a cross-sectional view of the configuration of a Group III nitride semiconductor light-emitting device according to still another embodiment.

As shown in FIG. 9, a metal layer 80 formed of, for example, Au, Ti/Au, or Ni/Ti/Au may be stacked on the bonding portion 117A of the n-electrode 117 or the bonding portion 118A of the p-electrode 118, so as to further improve contact between the bonding portion 117A or 118A and a bonding wire. As shown in FIG. 10, the wiring portion 117B of the n-electrode 117 and the wiring portion 118B of the p-electrode 118 may be exposed without formation of the insulating film 22 on the wiring portions 117B and 118B. In such a case, when each of the n-electrode 117 and the p-electrode 118 has a multi-layer structure, the outermost layer (i.e., the layer most distal from the sapphire substrate 10) is not necessarily an Al layer. For example, the n-electrode 117 or the p-electrode 118, which is generally formed of Al alloy/Ti/Au/Al or Ag alloy/Ti/Au/Al, may be formed of Al alloy/Ti/Au, Ag alloy/Ti/Au, or Ag alloy/Ni/Ti/Au, with the outermost Al layer being omitted.

In the Group III nitride semiconductor light-emitting device according to Embodiment 5, since each of the n-electrode 17 and the p-electrode 18 itself is formed of a material of high reflectance, absorption of light by the n-electrode 17 and the p-electrode 18 is inhibited, and light extraction performance is improved. In the Group III nitride semiconductor light-emitting device according to Embodiment 5, since the grooves 14 are provided, the wiring portion 17B of the n-electrode 17 and the wiring portion 18B of the p-electrode 18 are located at a level lower than that of the light-emitting layer 12. Similar to the case of the reflective films 19 and 23 in Embodiment 1, the wiring portions 17B and 18B are formed of a material of high reflectance. Therefore, light reflected by the wiring portions 17B and 18B is less likely to be directed toward the light-emitting layer 12, and absorption of light by the light-emitting layer 12 is suppressed. When the device is sealed with a sealing resin, light which is reflected by the sealing resin and returns to the n-electrode 17 and the p-electrode 18 is reflected by the n-electrode 17 and the p-electrode 18 (i.e., absorption of light by these electrodes is prevented). Also, light propagating in a direction parallel to the main surface of the device (i.e., plane parallel to the main surface of the sapphire substrate 10) is readily extracted from the side surfaces of the grooves 14 to the outside of the device. For these reasons, the Group III nitride semiconductor light-emitting device according to Embodiment 5 exhibits improved light extraction performance.

For production of the Group III nitride semiconductor light-emitting device according to Embodiment 5, the process for forming the reflective films 19 and 23 can be omitted. Therefore, production processes can be simplified and production cost can be reduced, as compared with the case of the Group III nitride semiconductor light-emitting device according to Embodiment 1.

Figure 11:
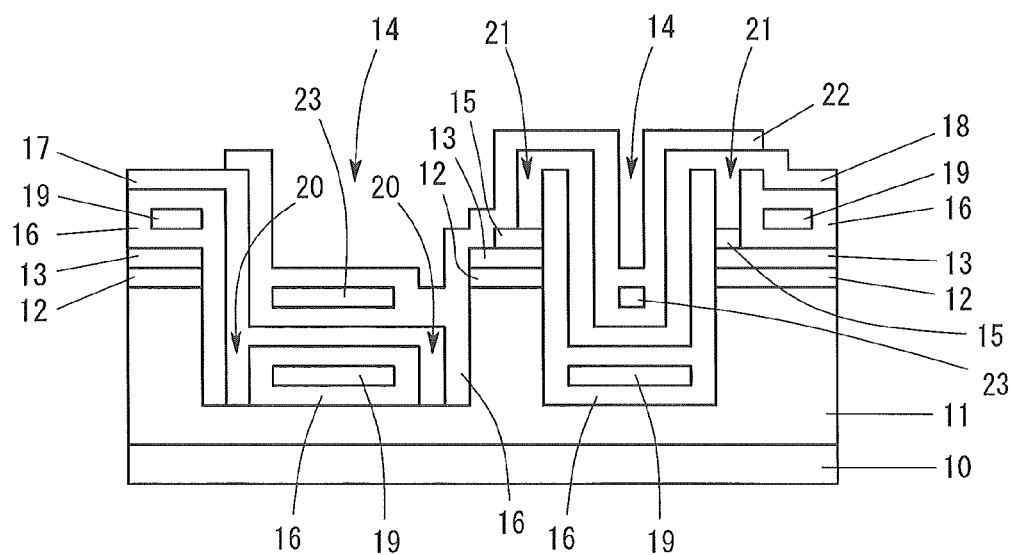
FIG. 11 is a cross-sectional view of the configuration of a Group III nitride semiconductor light-emitting device according to yet another embodiment.

In each of Embodiments 1 to 5, by means of the n-side intermediate electrodes 24 and the p-side intermediate electrodes 25, the n-type layer 11 is indirectly connected to the wiring portion 17B of the n-electrode 17, and the ITO electrodes 15 are indirectly connected to the wiring portion 18B of the p-electrode 18. However, the n-side intermediate electrodes 24 and the p-side intermediate electrodes 25 may be omitted; the wiring portion 17B of the n-electrode 17 may be directly connected to the n-type layer 11; and the wiring portion 18B of the p-electrode 18 may be directly connected to the ITO electrodes 15. FIG. 11 is a cross-sectional view of the configuration of a modification of the Group III nitride semiconductor light-emitting device according to Embodiment 1, in which the n-side intermediate electrodes 24 and the p-side intermediate electrodes 25 are omitted; the wiring portion 17B of the n-electrode 17 is directly connected to the n-type layer 11; and the wiring portion 18B of the p-electrode 18 is directly connected to the ITO electrodes 15.

Figure 12:
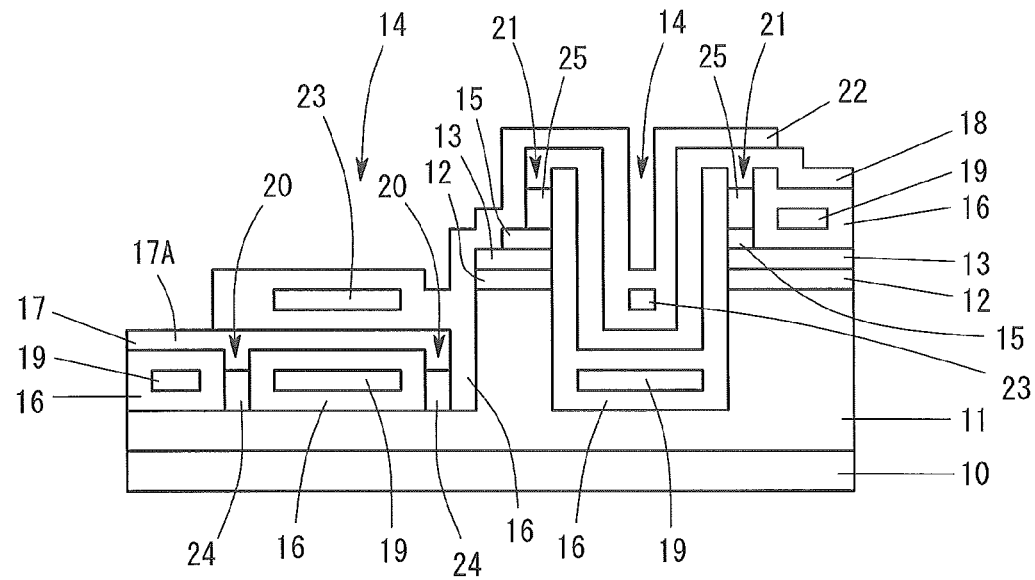
FIG. 12 is a cross-sectional view of the configuration of a Group III nitride semiconductor light-emitting device according to yet another embodiment.

In Embodiments 1 to 5, the grooves 14 are provided in regions directly below the wiring portion 17B of the n-electrode 17 and the wiring portion 18B of the p-electrode 18, such that the reflective films 19 and 23 in the regions are located at a level lower than that of the light-emitting layer 12. The groove 14 may be provided in a region directly below one or both of the bonding portion 17A of the n-electrode 17 and the bonding portion 18A of the p-electrode 18. However, in such a case, difficulty may be encountered in attaching a bonding wire, since the bonding portion 17A and/or the bonding portion 18A is located at a lower level. FIG. 12 is a cross-sectional view of the configuration of a modification of the Group III nitride semiconductor light-emitting device according to Embodiment 1, in which the groove 14 is also provided in a region directly below the bonding portion 17A of the n-electrode 17. As is clear from FIG. 12, through provision of the additional groove 14, the bonding portion 17A of the n-electrode 17 is located at a level lower than that of the bonding portion 17A of the n-electrode 17 of the Group III nitride semiconductor light-emitting device according to Embodiment 1 shown in FIG. 1.

Figure 7:
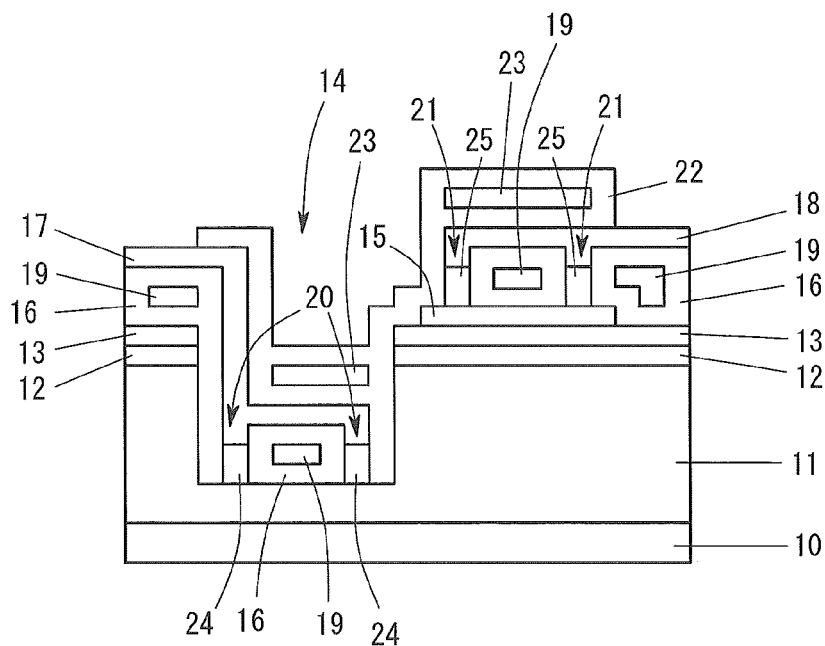
FIG. 7 is a cross-sectional view of the configuration of a Group III nitride semiconductor light-emitting device according to another embodiment.
Figure 13:
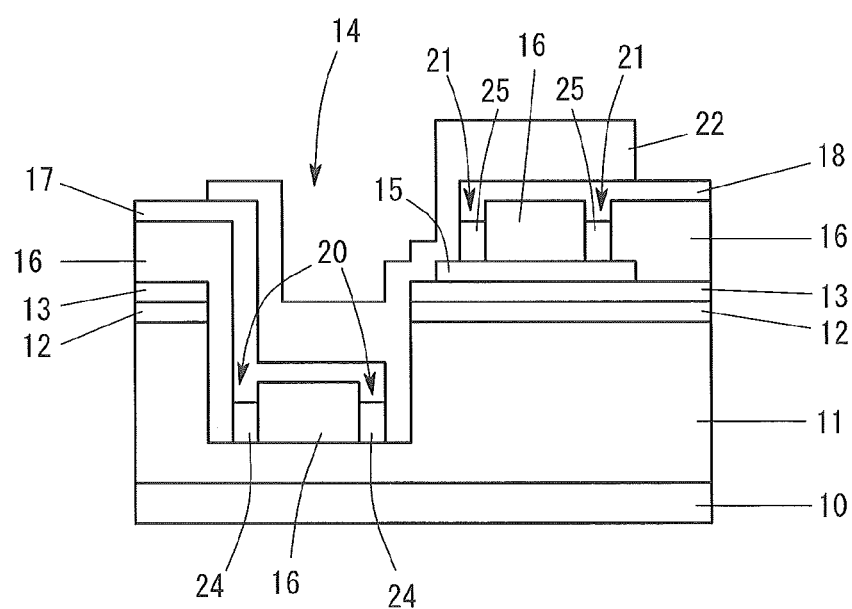
FIG. 13 is a cross-sectional view of the configuration of a Group III nitride semiconductor light-emitting device according to yet another embodiment.

In Embodiments 1 to 5, the groove 14 may be provided only in a region directly below the wiring portion 17B of the n-electrode 17 (i.e., the groove 14 is not provided in a region directly below the wiring portion 18B of the p-electrode 18). In such a case, since the area of the light-emitting layer 12 increases as compared with the cases of Embodiments 1 to 5, emission performance may be improved. FIG. 7 is a cross-sectional view of the configuration of a modification of the Group III nitride semiconductor light-emitting device according to Embodiment 1, in which the groove 14 is provided only in a region directly below the wiring portion 17B of the n-electrode 17 (i.e., the groove 14 is not provided in a region directly below the wiring portion 18B of the p-electrode 18). FIG. 13 is a cross-sectional view of the configuration of a modification of the Group III nitride semiconductor light-emitting device according to Embodiment 5, in which the groove 14 is provided only in a region directly below the wiring portion 17B of the n-electrode 17 (i.e., the groove 14 is not provided in a region directly below the wiring portion 18B of the p-electrode 18).

In contrast, the groove 14 may be provided only in a region directly below the wiring portion 18B of the p-electrode 18 (i.e., the groove 14 is not provided in a region directly below the wiring portion 17B of the n-electrode 17). Similar to the aforementioned case, since the area of the light-emitting layer 12 increases as compared with the cases of Embodiments 1 to 5, emission performance may be improved.

The Group III nitride semiconductor light-emitting device of the present invention can be employed as a light source of an illumination apparatus or a display apparatus.

What is claimed is:
1. A face-up-type Group III nitride semiconductor light-emitting device, comprising:
   a growth substrate;
   an n-type layer;
   a light-emitting layer;
   a p-type layer;
   an electrically conductive transparent film formed on the p-type layer;
   an n-electrode including a bonding portion and a wiring portion;
   a p-electrode including a bonding portion and a wiring portion, the n-electrode being isolated from the p-electrode and the electrically conductive transparent film;
   an n-type layer side insulating film on which the wiring portion of the n-electrode is disposed; and
   a p-type layer side insulating film on which the wiring portion of the p-electrode is disposed;
   the n-type layer, the light-emitting layer, and the p-type layer being sequentially stacked on the growth substrate,
   wherein a groove having a depth extending from the top surface of the p-type layer to the n-type layer is formed in only a region directly below the wiring portion of the n-electrode and the groove comprises a linear structure extending in a direction parallel to a main surface of the device and the groove has both side walls which are made of side walls of the n-type layer, the light-emitting layer and the p-type layer belonging to a same device and including a bottom surface which includes an exposed surface of the n-type layer of the same device,
   wherein the wiring portion of the n-electrode is disposed on the n-type layer side insulating film formed in the groove and comprises a linear structure extending along the groove, wherein the wiring portion of the n-electrode, which is formed on the n-type layer side insulating film in the groove, is located at a level lower than a level of the light-emitting layer, wherein the n-type layer side insulating film comprises first contact holes and the wiring portion of the n-electrode contacts with the n-type layer through the first contact holes, and the p-type layer side insulating film comprises second contact holes and the wiring portion of the p-electrode contacts with the electrically conductive transparent film through the second contact holes, and wherein the wiring portions of the n-electrode and the p-electrode act as a reflective film.

2. A Group III nitride semiconductor light-emitting device according to claim 1, wherein a top surface of the wiring portion of the n-electrode is located at the level lower than a level of the light-emitting layer.

3. A Group III nitride semiconductor light-emitting device according to claim 1, wherein each of the n-electrode and the p-electrode comprises at least one of Ag, Al, an Ag alloy, and an Al alloy.

4. A Group III nitride semiconductor light-emitting device according to claim 2, wherein each of the n-electrode and the p-electrode comprises at least one of Ag, Al, an Ag alloy, and an Al alloy.

5. A Group III nitride semiconductor light-emitting device, comprising:
   a growth substrate;
   an n-type layer;
   a light-emitting layer;
   a p-type layer;
   an n-electrode including a bonding portion and a wiring portion;
   a p-electrode including a bonding portion and a wiring portion, the n-electrode being isolated from the p-electrode;
   an n-type layer side insulating film on which the wiring portion of the n-electrode is disposed; and
   a p-type layer side insulating film on which the wiring portion of the p-electrode is disposed,
   the n-type layer, the light-emitting layer, and the p-type layer being sequentially stacked on the growth substrate, wherein a groove having a depth extending from a top surface of the p-type layer to the n-type layer is formed in only a region directly below the portion of the n-electrode, and the groove comprises a linear structure extending in a direction parallel to a main surface of the device and the groove has both side walls which are made of side walls of the n-type layer, the light-emitting layer and the p-type layer belonging to a same device and including a bottom surface which includes an exposed surface of the n-type layer of the same device, wherein the wiring portion of the n-electrode is disposed on the n-type layer side insulating film formed in the groove and comprises a linear structure extending along the groove, and wherein a top surface of the wiring portion of the n-electrode which is formed on the n-type layer side insulating film in the groove is located at a level lower than a level of the light-emitting layer.

6. A Group III nitride semiconductor light-emitting device according to claim 1, wherein the wiring portions of the n-electrode and the p-electrode are covered with a second insulating film.

7. A Group III nitride semiconductor light-emitting device according to claim 2, wherein the wiring portions of the n-electrode and the p-electrode are covered with a second insulating film.

8. A Group III nitride semiconductor light-emitting device according to claim 5, wherein the wiring portions of the n-electrode and the p-electrode are covered with a second insulating film.

9. A Group III nitride semiconductor light-emitting device according to claim 1, wherein the wiring portions of the n-electrode and the p-electrode are exposed.

10. A Group HT nitride semiconductor light-emitting device according to claim 2, wherein the wiring portions of the n-electrode and the p-electrode are exposed.

11. A Group III nitride semiconductor light-emitting device according to claim 5, wherein the wiring portions of the n-electrode and the p-electrode are exposed.

12. A Group III nitride semiconductor light-emitting device according to claim 5, wherein the wiring portions of the n-electrode and the p-electrode act as a reflective film.

* * * * *